Inventor
JOHN P. STELMAK
By H. W. Newton
Attorney

Dec. 29, 1953

J. P. STELMAK 2,664,528

VACUUM-ENCLOSED SEMICONDUCTOR DEVICE

Filed Dec. 23, 1949

2 Sheets-Sheet 2

Inventor

JOHN P. STELMAK

By H. W. Newton

Attorney

Patented Dec. 29, 1953

2,664,528

UNITED STATES PATENT OFFICE 2,664,528

VACUUM-ENCLOSED SEMICONDUCTOR DEVICE

John P. Stelmak, Forest Hills, N. Y., assignor to Radio Corporation of America, a corporation of Delaware Application December 23, 1949, Serial No. 134,657

6 Claims. (Cl. 317—235)

This invention relates generally to semi-conductor devices, and particularly relates to a semi-conductor amplifier, oscillator or the like, the electrical characteristics of which will substantially not deteriorate with time and which has a longer useful life than previously known devices of the semi-conductor type.

A semi-conductor amplifier or oscillator includes a semi-conductor crystal such as a germanium crystal having a large-area electrode in contact therewith and two or more small-area electrodes. The large-area electrode forms a low-resistance, non-rectifying contact with the crystal and is called the base electrode. The small-area electrodes are called emitter and collector electrodes and form high-resistance, rectifying contacts with the crystal; these electrodes need not necessarily be point contacts provided they are in rectifying contact with the crystal. A small forward bias voltage is impressed between the base electrode and one of the rectifying electrodes which is the emitter electrode. A comparatively large reverse bias voltage is impressed between the base electrode and the collector electrode. Such a device is known as a transistor. A semi-conductor modulator may be provided with two emitter electrodes for impressing simultaneously two signals on the device.

The shelf life of presently known semi-conductor devices is not as long as would be desired. During the useful life of such devices the initial gain often becomes reduced, and the output current is lowered. Sometimes the electrical characteristics of such devices may suffer erratic variations from day to day. It is obvious that such behavior is undesirable for any commercial application of semi-conductor devices. It is believed that such undesirable changes of the electrical characteristics of semi-conductor devices are due to the influence of atmospheric gases and vapors. It has been known for some time to impregnate crystal rectifiers and also transistors with a suitable wax to protect particularly the point electrodes and the surrounding area of the crystal surface. However, a transistor impregnated with a suitable wax may not show less variations of its electrical characteristics than an unprotected device and its gain may be reduced within a few months to such a low value that it must be discarded. It is believed that the moisture of the air may short-circuit the two point electrodes which are usually spaced no more than a few mils apart. Furthermore, a film of moisture on the crystal surface may cause undesirable electrolytic action. Apparently, this undesirable action cannot in all cases be effectively prevented by covering the crystal surface with a wax such as a mixture of "Paratac" and "Opal" wax as recommended in the book "Crystal Rectifiers" by H. C. Torrey and C. A. Whitmer published by McGraw-Hill Book Company, Inc., New York, 1948 (see page 325).

It is accordingly the principal object of the present invention to provide an improved semi-conductor device suitable, for example, as an amplifier or oscillator and having a prolonged life and electrical characteristics which will vary but little over the useful life of the device.

A further object of the invention is to protect a semi-conductor device of the type referred to fom the deleterious effect of atmospheric gases and vapors thereby to maintain its gain at its high initial value and to increase its useful life.

A semi-conductor device may comprise a semi-conducting body, a low-resistance electrode in contact with the body and two or more rectifying electrodes in contact with the body. In accordance with the present invention the device is enclosed by an air-tight evacuated envelope whereby the device is protected from the deleterious action of the atmosphere and its useful life prolonged. The air-tight evacuated envelope which encloses the device preferably is provided with a chemical getter as is conventional in vacuum tube discharge devices.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings, in which:

Figure 3A:
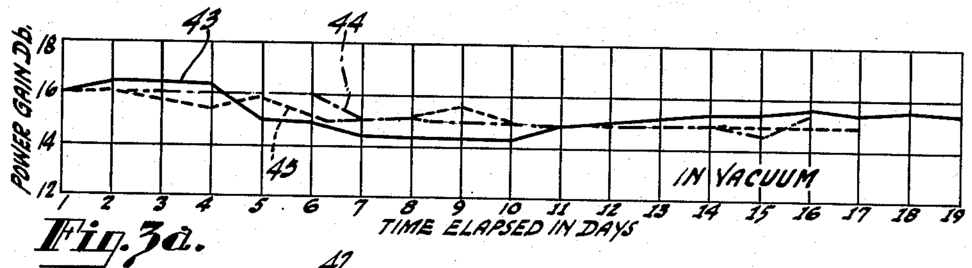
Figure 3B:
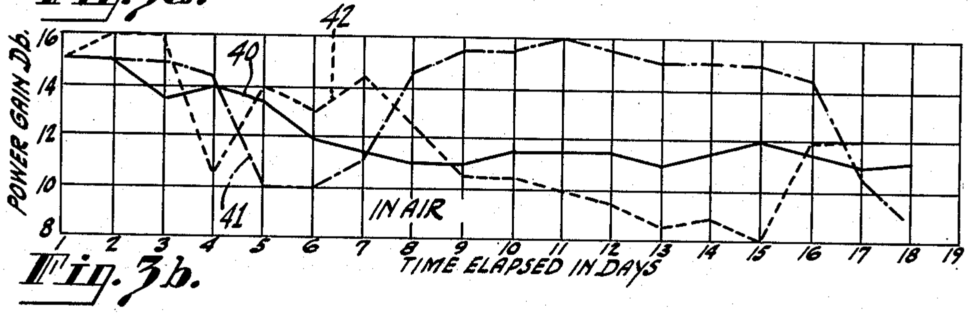
Figure 3C:
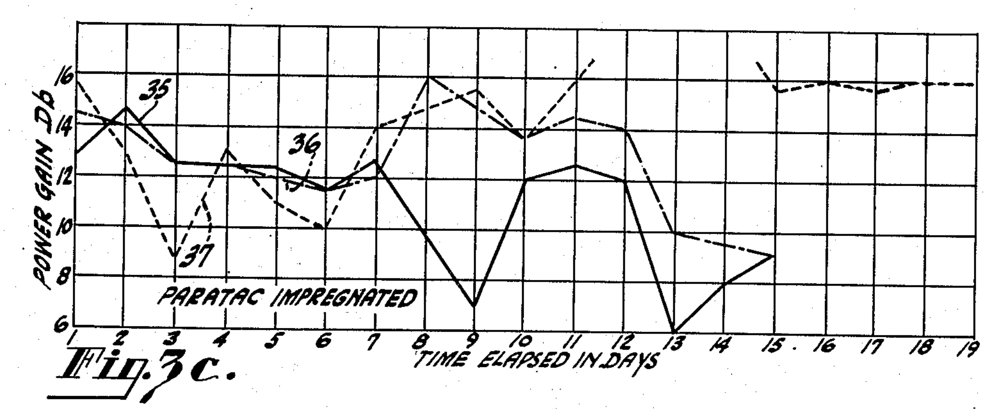
Figure 4A:
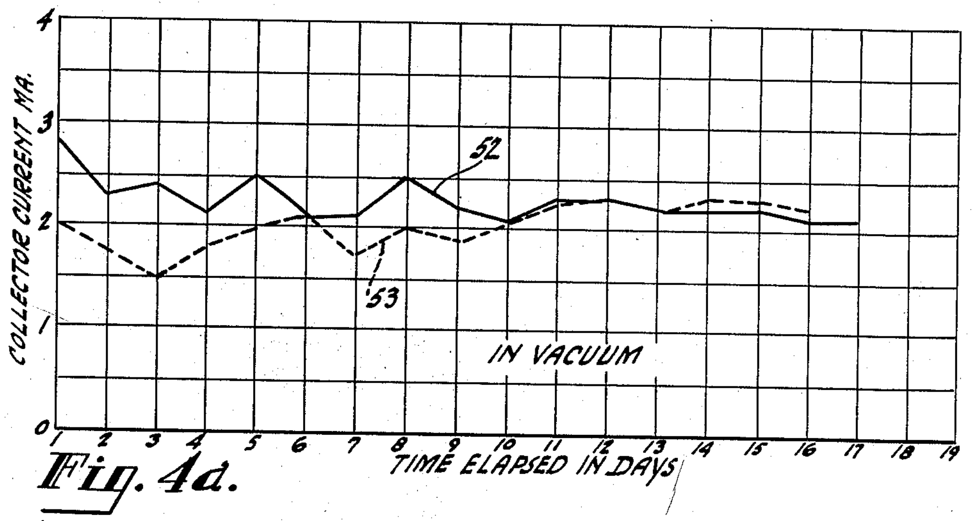
Figure 4B:
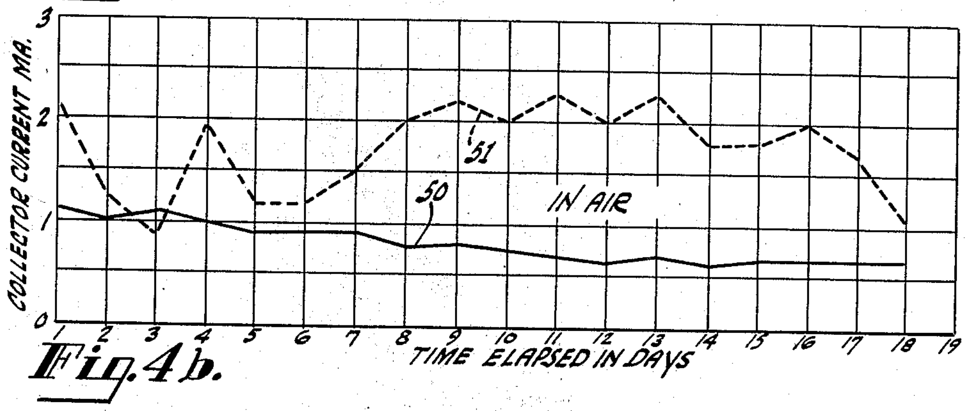
Figure 4C:
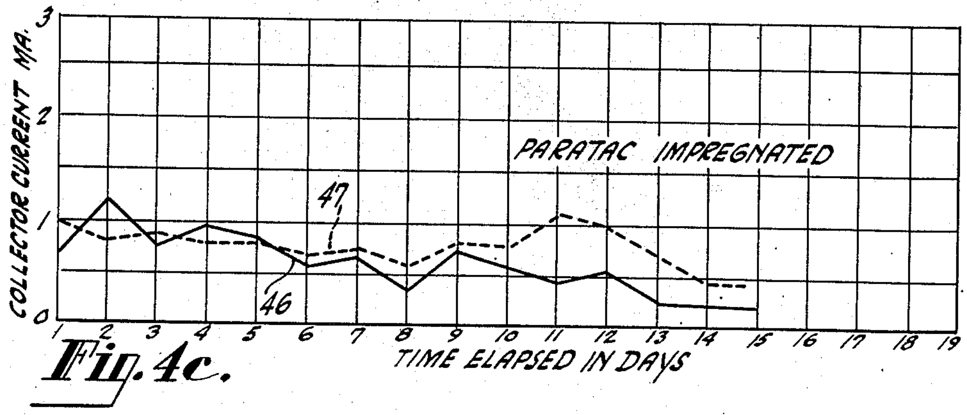

Figures 3*a*, 3*b* and 3*c* are graphs showing curves illustrating the change of the power gain over a period of time of several semi-conductor amplifiers, some of which have been constructed in accordance with the invention; and Figures 4*a*, 4*b* and 4*c* are graphs showing curves illustrating the variation of collector current over a period of time of a group of transistors, some of which have been constructed in accordance with the present invention.

Figure 1:
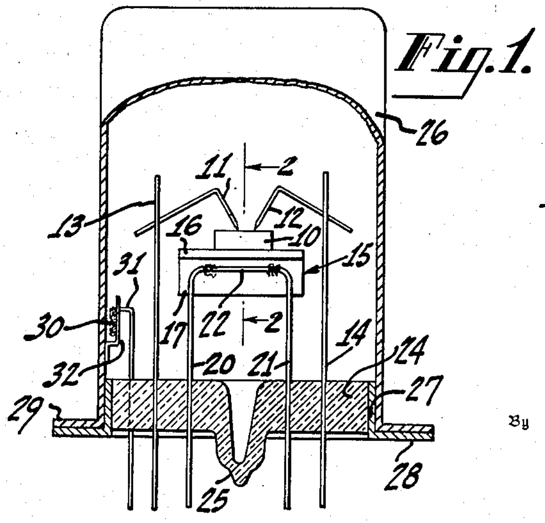
Figure 1 is an elevational view, partly in section, of a semi-conductor device embodying the present invention.
Figure 2:
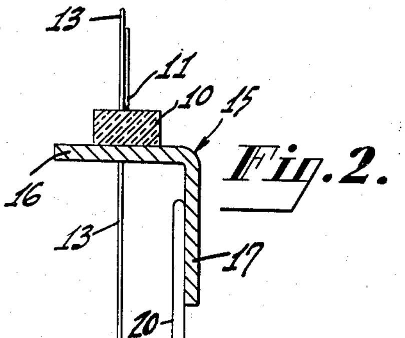
Figure 2 is a sectional view on enlarged scale taken on line 2—2 of Figure 1 and illustrating the construction of an electrode of the device shown in Figure 1.

Referring now to the drawings in which like components have been designated by the same reference numerals throughout the figures, and particularly to Figures 1 and 2, there is illustrated a semi-conductor device embodying the present invention which may be used as an amplifier, oscillator or the like. The device comprises a block or body 10 of semi-conducting material consisting, for example, essentially of a chemical element having semi-conducting properties such as germanium, silicon, boron, tellurium, or selenium containing a small but sufficient number of atomic impurity centers or lattice imperfections as commonly employed for best results in crystal rectifiers. Germanium is the preferred material for block 10 and may be prepared so as to be an electronic N type semi-conductor crystal as is well known. The top surface of semi-conducting block 10 may be polished and etched as is conventional. It is also feasible to utilize the germanium block from a commercial high-back-voltage germanium rectifier such as the type 1N34.

Electrodes 11 and 12 are in contact with the top surface of block 10. Electrodes 11 and 12 may be the emitter and collector electrodes and preferably are point contacts having a high-resistance, rectifying contact with block 10. Electrodes 11 and 12 may consist, as shown, of a stiff wire of tungsten or phosphor bronze having a pointed tip as illustrated. Electrodes 11 and 12 are welded or otherwise rigidly secured to conductors 13, 14 which may consist of relatively heavy stiff wires. Electrodes 11 and 12 are provided with a bend intermediate their ends so that the distance between the tips of the electrodes will remain substantially constant when block 10 is moved against the electrodes to provide the desired contact pressure. This has been explained more in detail in the copending application to George M. Rose, filed on April 30, 1949, Serial No. 90,702 on which Patent 2,538,593 was granted on January 16, 1951 which claims such an electrode construction.

The base electrode of the semi-conductor device may consist of a piece of sheet metal having a cross-section of substantially L-shape as indicated at 15. Member 15 has a horizontal shelf portion 16 and a vertical depending portion 17. Crystal 10 is soldered or sweated to shelf portion 16 to provide a low-resistance, non-rectifying electrode usually called the base electrode. Body 10 is accordingly fixed to member 15. Member 15 in turn is supported by a pair of conductors 20, 21 having a loop indicated at 22 which is welded or otherwise secured to the vertical depending portion 17 of member 15.

Conductors or wires 13, 14 and 20, 21 extend through an insulating electrode support 24 which preferably consists of glass and which has a tubular extension 25 which may be sealed off as clearly shown in Figure 1. Wires 13, 14, 20, 21 are, of course, hermetically sealed through electrode support 24.

In accordance with the present invention the semi-conductor device is enclosed in an evacuated air-tight housing 26 which has a hermetic seal with electrode support 24. Housing 26 may, for example, consist of metal such as cold-rolled steel. Preferably, a metal header 27 is bonded to electrode support 24 and has a horizontal flange indicated at 28. Housing 26 which also has a horizontal flange 29 may then be welded to metal header 27 to provide a hermetic seal between electrode support 24 and housing 26. This is preferably effected by welding flanges 28, 29 together.

After the device is assembled as shown in Figure 1, housing 26 is welded to its metal header 27 and thereafter the housing is evacuated through tubular extension 25 which is then sealed off. The vacuum in housing 26 may, for example, be approximately one micron of mercury pressure. Preferably, a getter shown at 30 is provided on an inner wall of housing 26. The getter may, for example, consist of barium-titanate and beryllium powder. This getter may be held in a metallic ribbon 32 welded to housing 26 and secured to a loop of wire 31. The getter material is evaporated by a current flowing through loop 31 and ribbon 32 to heat the getter whereupon it will condense on the wall of housing 26 as shown at 30.

The superior electrical characteristics of a semi-conductor device enclosed in an air-tight evacuated envelope are illustrated in Figures 3*a*, 3*b* and 3*c* and 4*a*, 4*b*, 4*c* to which reference is now made. Thus, Figures 3*a* to 3*c* illustrate the power gain of various semi-conductor amplifiers as a function of the elapsed time in days. The amplifiers were measured once a day and the intervals between the measurements were idle periods. Curves 35, 36 and 37 of Figure 3*c* show the wide variations of the power gain measured in db (decibels) which occur when the point electrodes and the top surface of the germanium block are impregnated with "Paratac." Curve 35, for example, shows that the initial gain of 13 db first increases to 15 db and then decreases to 6 db in less than two weeks corresponding to a change of the gain compared to the initial gain of +15 per cent and −54 per cent. The other two curves show a slightly smaller percentage variation.

Curves 40, 41 and 42 of Figure 3*b* indicate the variation in power gain over a period of time if the semi-conductor amplifiers are left unprotected in the open atmosphere. The variations of the gain are still appreciable. Thus, curve 42 shows that the initial gain of 15 db increases to 16 db and decreases to 8 db in 15 days corresponding to a percentage variation of +7 per cent and −47 per cent with respect to the initial gain.

Finally, curves 43, 44 and 45 of Figure 3*a* show the variation of the power gain with time for three semi-conductor amplifiers which are enclosed in an evacuated housing as illustrated in Figures 1 and 2. It will be noticed that the initial power gain of 16 db decreases less than two db within 19 days which corresponds to a percentage variation of −12 per cent. The increase of the gain over the initial gain is negligible. It will accordingly be obvious that the gain of a device in accordance with the present invention varies very little over an appreciable period of time in contra-distinction to devices which are either impregnated with wax or exposed to the air.

Figures 4*a* to 4*c* illustrate the variations of the collector current in milliamperes (ma.) of the same devices over the same period of time shown in Figures 3*a* to 3*c*. The collector currents have been plotted at a collector voltage of −45 volts with respect to the base voltage, and the emitter voltage was adjusted to give maximum power gain in all cases. Thus, curves 46 and 47 of Figure 4*c* indicate the collector current for two semi-conductor amplifiers impregnated with "Paratac." Curve 46 shows that the collector current varies between .2 and 1.3 ma. corresponding to a percentage variation of +100 per cent and −70 per cent from the initial value.

Curves 50 and 51 of Figure 4*b* show the variation of the collector current with time for two semi-conductor amplifiers which were left exposed to the air. Curve 51 shows a variation of the collector current between .8 and 2.3 corresponding to +9 per cent and −64 per cent variation from the initial value. Even curve 50 shows a percentage variation of −45 per cent from the initial collector current of 1.1 ma.

Finally, curves 52 and 53 of Figure 4*a* show the variation of the collector current with time for two semi-conductor amplifiers which are enclosed by an evacuated housing. The percentage decrease of the collector current for both curves 52 and 53 amounts to −25 per cent only from the initial collector current value. The percentage increase of the collector current for curve 53 is +15 per cent. Curve 52 shows an initial collector current of 2.8 ma. which is appreciably higher than that of curves 46, 47 or 50, 51. It should ordinarily be expected that a high collector current should cause a high variation of the current over a period of time because a higher steady collector current will develop more heat which in turn should give more cause for a variation of the current. Nevertheless, the percentage variation of the collector current for devices in accordance with the invention is considerably smaller than that for other devices which are either left exposed to the air or which are impregnated with wax. It is believed that curves 3a and 4a clearly show the superior electrical characteristics of a semi-conductor device in accordance with the invention.

There has thus been disclosed a semi-conductor device which is enclosed by an air-tight evacuated housing. This will maintain the power gain of the device at its initial high value and will prevent large variations of the collector current and of other electrical characteristics over a period of time.

What is claimed is:

1. A semi-conductor device comprising a semi-conducting body, at least two rectifying electrodes in contact with said body, a low-resistance electrode consisting of a metallic member having a cross-section of substantially L-shape, said body being connected with and soldered to one portion of said member, a common electrode support of insulating material, a plurality of conductors hermetically sealed in and extending through said support in spaced apart relation, said rectifying electrodes being secured to individual ones of said conductors, one of said conductors forming a loop secured to another portion of said member, and an evacuated air-tight housing having a hermetic seal with said support and enclosing said body and said electrodes.

2. A semi-conductor device comprising a semi-conducting body of germanium, at least two rectifying electrodes in contact with said body, a low-resistance electrode consisting of a metallic member having a shelf portion and a depending portion disposed substantially at right angles to said shelf portion, said body being soldered to said shelf portion, a common electrode support of insulating material, a plurality of conductors hermetically sealed in and extending through said support in spaced apart relation, said rectifying electrodes being secured to individual ones of said conductors, two of said conductors forming a loop welded to said depending portion, and an evacuated air-tight housing having a hermetic seal with said support and enclosing said body and said electrodes.

3. A semi-conductor device comprising a semi-conducting body, at least two rectifying electrodes in contact with said body, a low resistance electrode consisting of a metallic member having a shelf portion and a depending portion disposed substantially at right angles to said shelf portion, said body being soldered to said shelf portion, a common electrode support of glass, a plurality of conductors hermetically sealed in and extending through said support in spaced apart relation, said rectifying electrodes being secured to individual ones of said conductors, two of said conductors forming a loop welded to said depending portion, an evacuated air-tight housing having a hermetic seal with said support and enclosing said body and said electrodes, and a getter on an inner surface of said housing.

4. A semi-conductor device comprising a semi-conducting body, at least two rectifying electrodes in contact with said body, a low-resistance electrode consisting of a metallic member having a cross-section of substantially L-shape, said body being connected with and soldered to one portion of said member, a common electrode support of insulating material, a plurality of conductors hermetically sealed in and extending through said support in spaced apart relation, said rectifying electrodes being secured to individual ones of said conductors, at least one of said conductors being connected to said metallic member, and an evacuated airtight housing having a hermetic seal with said support and enclosing said body and said electrodes.

5. A semi-conductor device comprising a semi-conducting body of germanium, at least two rectifying electrodes in contact with said body, a low-resistance electrode consisting of a metallic member having a shelf portion and a depending portion disposed substantially at right angles to said shelf portion, said body being soldered to said shelf portion, a common electrode support of insulating material, a plurality of conductors hermetically sealed in and extending through said support in spaced apart relation, said rectifying electrodes being secured to individual ones of said conductors, at least one of said conductors being connected to a portion of said metallic member, and an evacuated air-tight housing having a hermetic seal with said support and enclosing said body and said electrodes.

6. A semi-conductor device comprising a semi-conducting body, at least two rectifying electrodes in contact with said body, a low resistance electrode consisting of a metallic member having a shelf portion and a depending portion disposed substantially at right angles to said shelf portion, said body being soldered to said shelf portion, a common electrode support of glass, a plurality of conductors hermetically sealed in and extending through said support in spaced apart relation, said rectifying electrodes being secured to individual ones of said conductors, one of said conductors being connected to a portion of said metallic member, an evacuated air-tight housing having a hermetic seal with said support and enclosing said body and said electrodes, and a getter on an inner surface of said housing.

JOHN P. STELMAK.

References Cited in the file of this patent

UNITED STATES PATENTS

| Number | Name | Date |
|---|---|---|
| 756,676 | Midgley | Apr. 5, 1904 |
| 817,664 | Plecher | Apr. 10, 1906 |
| 1,799,854 | Levy | Apr. 7, 1931 |
| 2,082,268 | Varian | Jan. 1, 1937 |
| 2,209,870 | Anderson | July 30, 1940 |
| 2,383,735 | Ray | Oct. 28, 1945 |
| 2,468,051 | Escoffery | Mar. 26, 1949 |
| 2,486,776 | Barney | Nov. 1, 1949 |
| 2,595,475 | McLaughlin | May 6, 1952 |

FOREIGN PATENTS

| Number | Country | Date |
|---|---|---|
| 251,706 | Great Britain | May 11, 1926 |